US007171185B2

United States Patent
Matsumoto et al.

(10) Patent No.: US 7,171,185 B2
(45) Date of Patent: Jan. 30, 2007

(54) DIRECT CONVERSION RECEIVER AND DC OFFSET REDUCING METHOD

(75) Inventors: Hidenori Matsumoto, Yokohama (JP); Toshio Obara, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 615 days.

(21) Appl. No.: 10/469,290

(22) PCT Filed: Jan. 28, 2003

(86) PCT No.: PCT/JP03/00783

§ 371 (c)(1),
(2), (4) Date: Aug. 28, 2003

(87) PCT Pub. No.: WO03/065600

PCT Pub. Date: Aug. 7, 2003

(65) Prior Publication Data

US 2004/0097212 A1 May 20, 2004

(30) Foreign Application Priority Data

Jan. 29, 2002 (JP) .............................. 2002-020251

(51) Int. Cl.
    *H04B 1/26* (2006.01)
(52) U.S. Cl. ................ 455/324; 455/240.1; 455/250.1; 455/340; 375/345
(58) Field of Classification Search ............ 455/232.1, 455/234.1, 240.1, 243.1, 245.1, 250.1, 266, 455/296, 311, 312, 313, 323, 324, 334, 338, 455/341, 339, 340; 375/345
See application file for complete search history.

(56) References Cited

U.S. PATENT DOCUMENTS 6,311,051 B1 * 10/2001 Jung .......................... 455/296

(Continued)

FOREIGN PATENT DOCUMENTS

JP         08316997         11/1996

(Continued)

OTHER PUBLICATIONS

International Search Report dated Apr. 15, 2003.

(Continued)

*Primary Examiner*—Edward F. Urban
*Assistant Examiner*—Nhan T. Le
(74) *Attorney, Agent, or Firm*—Stevens, Davis, Miller & Mosher, LLP

(57) ABSTRACT

A determining section (18) and gain variation amount detecting section (9) detect a period having a possibility of a DC-component offset in an internal circuit of a direct conversion receiver increasing beyond an allowable value due to AGC operation, and during the period, a cut-off frequency of each of high-pass filters (12a to 12d) is set at a frequency higher than that in general operation, thereby rapidly converging transient responses of signals passed through the high-pass filters, while controlling precisely operation timings of reception power measuring section (16), gain calculating section (22), gain control section (23) and circuit power supply control section (24) composing an AGC loop, whereby the DC offset is prevented from increasing and stable circuit operation is assured. It is thereby possible to achieve further reductions in size and power consumption of a CDMA receiver using the direct conversion receiver.

8 Claims, 16 Drawing Sheets

U.S. PATENT DOCUMENTS

| | | | |
|---|---|---|---|
| 6,442,380 B1 * | 8/2002 | Mohindra | 455/234.1 |
| 6,449,471 B1 * | 9/2002 | Katsura et al. | 455/324 |
| 6,498,929 B1 * | 12/2002 | Tsurumi et al. | 455/296 |
| 6,507,627 B1 | 1/2003 | Imura | |
| 6,560,448 B1 * | 5/2003 | Baldwin et al. | 455/234.1 |
| 7,062,244 B2 * | 6/2006 | Gharpurey et al. | 455/242.1 |
| 2002/0160734 A1 * | 10/2002 | Li et al. | 455/245.1 |

FOREIGN PATENT DOCUMENTS

| | | |
|---|---|---|
| JP | 08316998 | 11/1996 |
| JP | 10247953 | 9/1998 |
| JP | 11225179 | 8/1999 |
| JP | 2000216836 | 8/2000 |
| JP | 2001197136 | 7/2001 |
| JP | 2002261638 | 9/2002 |
| WO | 9729551 | 8/1997 |
| WO | 0054420 | 9/2000 |

OTHER PUBLICATIONS

English translation of International Search Report dated Apr. 15, 2003.

* cited by examiner

DIRECT CONVERSION RECEIVER AND DC OFFSET REDUCING METHOD

TECHNICAL FIELD

The present invention relates to a DC (Direct Current) offset reducing method, an AGC (Automatic Gain Control) circuit in a direction conversion receiver, a CDMA (Code Division Multiple Access) receiver and a baseband variable gain amplifying circuit.

BACKGROUND ART

A direct conversion receiver is a receiver that multiplies a RF signal received in an antenna by a carrier (local signal) of substantial same frequency and thus directly converts the RF signal into a baseband signal without eliminating conversion into a signal of intermediate frequency, and contributes to miniaturization, weight reduction and low power consumption in a radio receiver.

The direction conversion receiver is described in, for example, Japanese Laid-Open Patent Publication No.H10-247953.

However, in the direct conversion receiver, there is a problem that a direct current offset (hereinafter referred to as "DC offset") specific to the circuitry arises.

As measures against the DC offset, there is a method that a high-pass filter is inserted into a signal path to cut off a DC component using a capacitor, as shown in FIG. 11 in the above-mentioned Japanese Laid-Open Patent Publication No.H10-247953.

The inventor of the present invention considered installing a direct conversion receiver in a CDMA receiver such as a cellular telephone.

As a result, it was made clear that an AGC circuit indispensable to a CDMA receiver causes a DC offset to occur, and that the above-mentioned method of inserting a high-pass filter into a signal path does not solve the problem with the DC offset caused by the AGC circuit.

This problem is explained below.

In the case of a CDMA receiver, in either area of a weak electric field and storing electric field, the receiver always distinguishes information of a terminal provided with the receiver from data of another user accurately on a channel, and therefore, needs to have an AGC circuit that keeps amplitude of a signal to input to an A/D converter within a predetermined range.

The basic operation of the AGC circuit is measuring power of a received signal, comparing the power with a target value to generate a control signal, and varying a gain of a variable gain amplifier using the control signal (negative feedback control operation).

In the CDMA receiver, it is required to adjust at high speed a convergence coefficient of a variable gain amplifier so as to adapt to a current receiving state, particularly, in cases of immediately after the power is supplied, of immediately after the circuitry is activated in intermittent reception (where the cellular telephone in a stand-by state checks synchronization with a base station intermittently, while the circuit power supply is turned off to be in a low power consumption mode in other states), of performing handover between cells with different frequencies in a compressed mode, and of performing handover between base stations with different systems, for example, in Asian areas where base stations with different systems exist such as a W-CDMA system and GSM (Global System for Mobile communications), and in such cases, it is necessary to increase the gain of the negative feedback loop.

In other words, it is required to decrease an interval for updating a gain of a variable gain amplifier, while increasing a variation width of a control value per-one gain update.

When the gain of a variable gain amplifier is thus updated frequently by a large variation width, voltage fluctuations caused by gain switching are conveyed to a capacitor of the above-mentioned high-pass filter existing on a signal path, and as a result, an acute differential waveform is instantaneously output.

The differential waveform converges with elapsed time. However, when another differential waveform is subsequently output before the convergence, the differential waveforms overlap one another as shown in FIG. 1, and as a result, the DC voltage in the circuitry deviates greatly. In other words, a large DC offset occurs.

When such a large DC offset occurs, the accuracy in demodulated signal deteriorates, and accurate AGC becomes difficult.

As described above, a direct conversion receiver needs a high-pass filter to cut off a DC component, while a CDMA receiver needs an AGC circuit, and the high-pass filter is necessarily a structural element of the AGC loop.

Then, for example, at the initial time of AGC such as the time the power is supplied, it is also necessary to increase the convergence coefficient of AGC (increase the gain variation amount) so as to respond to external propagation environments at high speed. Thus, when increasing the response capability of AGC to hasten the convergence, as described above, the DC offset is generated by overlapping of differential waveforms output from a high-pass filter in synchronization with switching of gain of a variable gain amplifier, resulting in contradictory facts that it finally becomes difficult to perform accurate AGC, and that the time increases required for the gain of the gain variable amplifier to converge.

Thus, when a direct conversion receiver is applied to, for example, a CDMA receiver equipped with an AGC circuit, the self-contradiction arises in the AGC operation, and accordingly, it is difficult to actually use the direct conversion receiver as a CDMA receiver.

DISCLOSURE OF INVENTION

The present invention aims to overcome problems newly found out by the inventor of the present invention, and it is an object of the present invention to provide a direct conversion receiver that enables a reduced DC offset caused by AGC and that further enables accurate and fast AGC while eliminating the problem with occurrence of DC offset.

In the present invention, a period is detected which has a high possibility that the DC offset increases, the time constant of a high-pass filter for cutting off a DC component existing on a signal path is made smaller, during the period, than that in general operation, transient response (differential waveform) of a signal passed through the high-pass filter thereby converges rapidly, and thus the DC offset is reduced to be negligible in the actual operation in the circuitry.

In this way, overlapping of differential waveforms is eliminated, and variations in DC are prevented from accumulating. Accordingly, a large DC offset is not generated.

Decreasing the time constant of a high-pass filter is implemented by increasing a cut-off frequency of the high-pass filter. However, when the cut-off frequency of a high-pass filter is made higher than a predetermined value, i.e., the cut-off frequency is brought close to the frequency of a modulated signal (received signal) component, variations in amplitude and phase of the modulated signal (received signal) component increase, and thus new problems arise that deviations in vector increase and that demodulation accuracy decreases.

The demodulation accuracy herein is E.V.M. (Error Vector Magnitude), and is determined by a difference between timing at which an actual received signal with distortion is demodulated and timing (ideal sampling point) at which a received signal with an ideal waveform is demodulated.

In other words, varying the time constant of the high-pass filter is equivalent to providing a waveform of the received signal with distortion different from the current one, and causes the demodulation accuracy to deteriorate.

Therefore, in the present invention, only when a large DC offset occurs (the possibility of the occurrence is high), the cut-off frequency of the high-pass filter is increased so as to promptly converge the occurred DC offset to a level the same as that in a steady state, while the cut-off frequency of the high-pass filter is kept at a low frequency except an above period.

In this way, by controlling switching of time constant of a high-pass filter appropriately corresponding to reception state (including operation state of a receiver), it is possible to effectively suppress DC offsets and to perform fast and accurate AGC while eliminating deterioration of reception accuracy.

In other words, the AGC circuit of the present invention is provided with a measure against an essential issue that the DC offset increases due to the own AGC operation of the circuit, and always assures its stable operation.

BEST MODE FOR CARRYING OUT THE INVENTION

It is a gist of the present invention to decrease a time constant of a high-pass filter to prevent variations in DC component from accumulating so as to reduce a DC offset when the DC offset increases due to AGC.

Methods for detecting a state where the DC offset is assumed to increase are broadly divided into following three methods.

A first method is of detecting a gain variation amount in gain control, and when the amount exceeds a predetermined threshold, judging that there is a risk of increasing a DC offset. A second method is of detecting in a user the time the power is supplied or intermittent reception is activated based on a control signal, and specifying timing at which a DC variation tends to occur. A third method is of obtaining information such as a move between cells from broadcast information contained in a received signal, and using the information, specifying timing at which a DC variation occur.

The present invention discloses detecting a state that expects concerns that a DC offset could increase due to switching of gain of a variable gain amplifier in AGC, using either of the above-mentioned methods, varying the time constant of a high-pass filter only for a period of few time, and presenting errors in DC component from accumulating.

Embodiments of the present invention will be described below with reference to accompanying drawings.

(First Embodiment)

It is a feature of the present invention to detect a gain variation amount of a variable gain amplifier, and switch a time constant of a high-pass filter.

Prior to explanations of a configuration and operation of a direct conversion receiver of the present invention, referring to FIGS. 1 to 9, reasons will be described below that switching of cut-off frequency of a high-pass filter is effective at reducing a DC offset in a direct conversion receiver.

Figure 2:
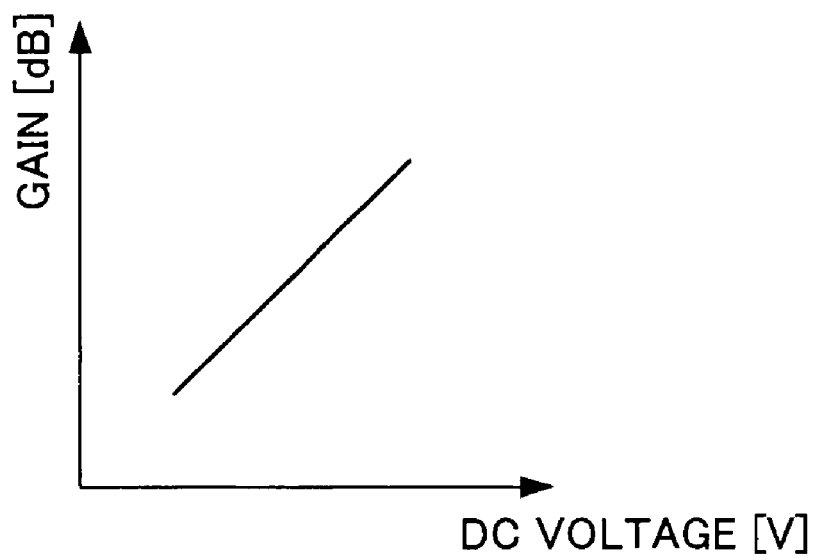
FIG. 2 is a graph showing the relationship between a control value (analog control voltage) and set gain in a variable gain amplifier in a baseband variable gain amplifying circuit.
Figure 3:
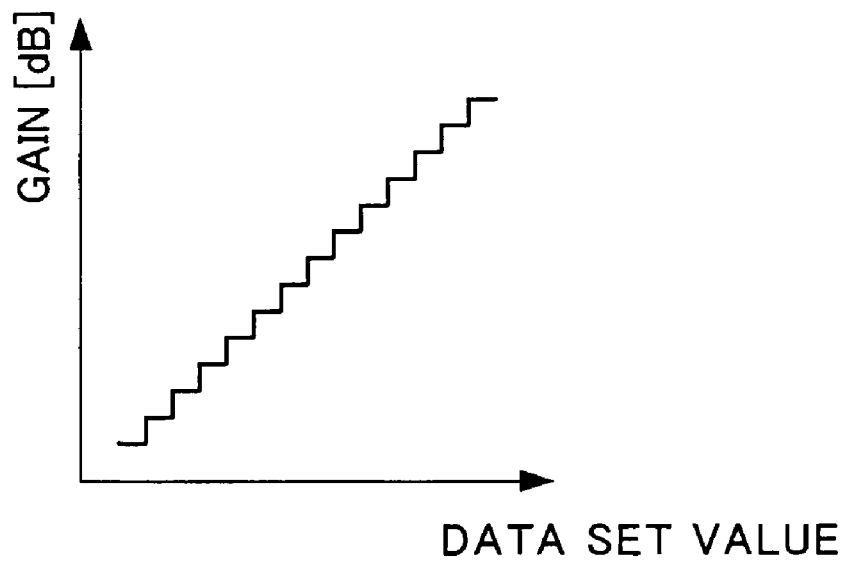
FIG. 3 is a graph showing the relationship between another control value (set data) and set gain in a variable gain amplifier in a baseband variable gain amplifying circuit.

FIG. 2 shows gain characteristics of a variable gain amplifier when the gain of the variable gain amplifying circuit is varied using an analog control voltage, and FIG. 3 shows gain characteristics of a variable gain amplifier when a digital control signal (serial data) is used to control.

The invention according to this embodiment can be implemented in a variable gain amplifying circuit with characteristics that the gain varies linearly as shown in FIG. 2 or 3.

Figure 4:
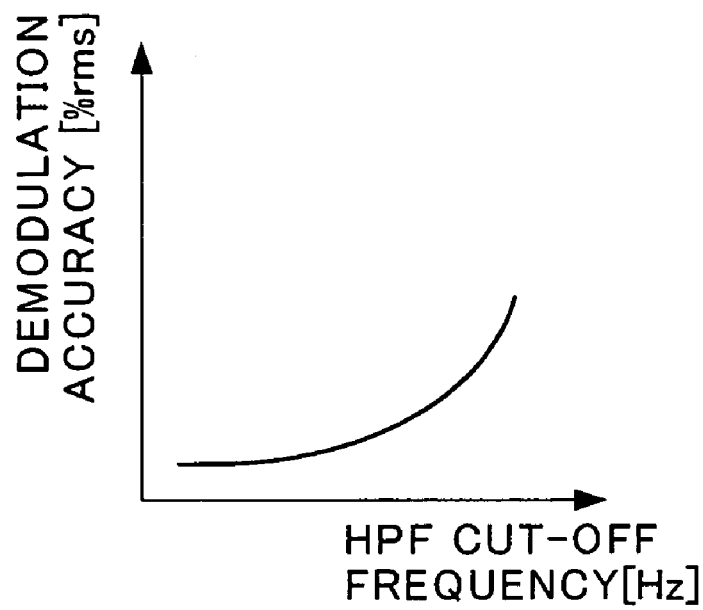
FIG. 4 is graph showing the relationship between the cut-off frequency of a high-pass filter and demodulation accuracy (error characteristics) in a direct conversion receiver as shown in FIG. 10.
Figure 5:
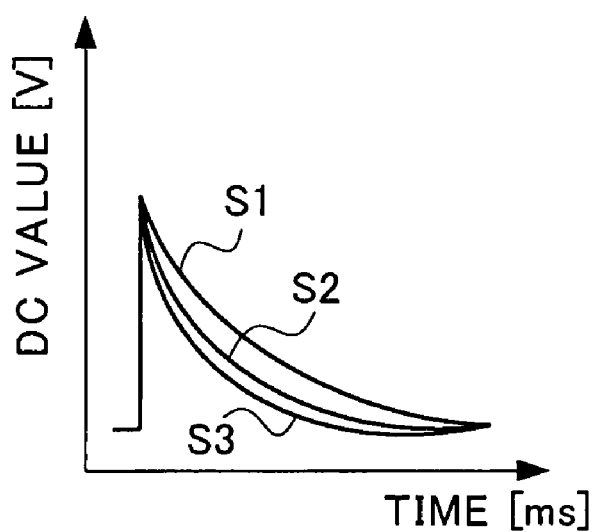
FIG. 5 is a graph showing convergence of transient response waveform when the cut-off frequency of a high-pass filter is varied in three levels.

FIG. 4 shows the relationship between a cut-off frequency of a high-pass filter and demodulation accuracy (error characteristics) of a received signal, and FIG. 5 shows convergence characteristics of differential waveforms for the cut-off frequency of the high-pass filter. In FIG. 5, the cut-off frequency increases in the order of characteristics S1, S2 and S3.

As can be seen from FIG. 4, as the cut-off frequency is made higher, variations in amplitude and phase of a modulated signal component are increased, and thereby demodulation accuracy deteriorates.

Further, as can be seen from FIG. 5, when the cut-off frequency of the high-pass filter is increased and a differential waveform occurs due to transient characteristics of the high-pass filter, the time required for convergence of the voltage level of the differential waveform is decreased.

In other words, as the cut-off frequency of a high-pass filter is increased, the differential waveform converges sooner, while the demodulation accuracy more deteriorates. Accordingly, when reception characteristics are given a high priority, the cut-off frequency of a high-pass filter should be decreased. On the contrary, when convergence of DC variation is given a high priority, the cut-off frequency of a high-pass filter should be increased.

Figure 6:
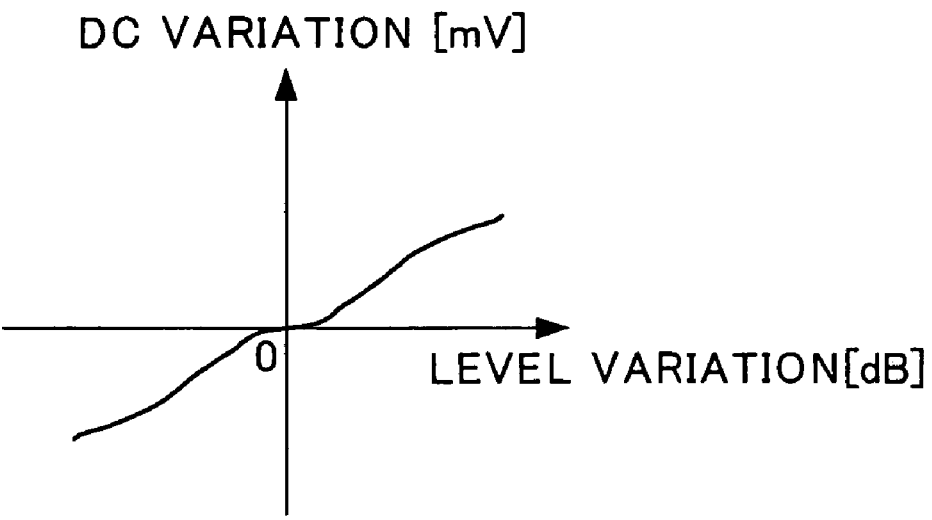
FIG. 6 is a graph showing a DC offset increased in proportion to variations in gain (variations in level) due to AGC in the direct conversion receiver in FIG. 10 when a gain for which a variable gain amplifier is set is varied.

FIG. 6 is a graph showing the correspondence relationship between a variation amount in gain for which the variable gain amplifier is set and an amount of DC offset to occur.

As can be seen from FIG. 6, in the baseband variable gain amplifying circuit, there is a tendency that a DC variation amount increases in proportion to a gain variation amount. From such a tendency, it is presumed that optimal control corresponding to circumstances can be carried out by increasing the cut-off frequency of a high-pass filter for a predetermined period until the DC variation is stabilized only when the variation is large in gain for which the variable gain amplifying circuit is set (under AGC mode 1), and decreasing the cut-off frequency in other cases (under AGC mode 2).

Figure 7:
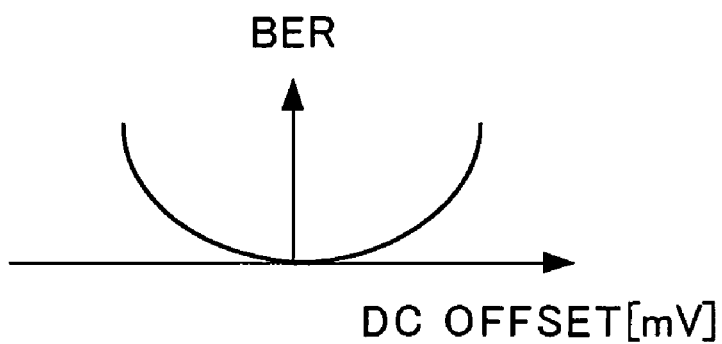
FIG. 7 is a graph showing the relationship between a DC offset amount and Bit Error Rate (BER) of a demodulated signal.
Figure 8:
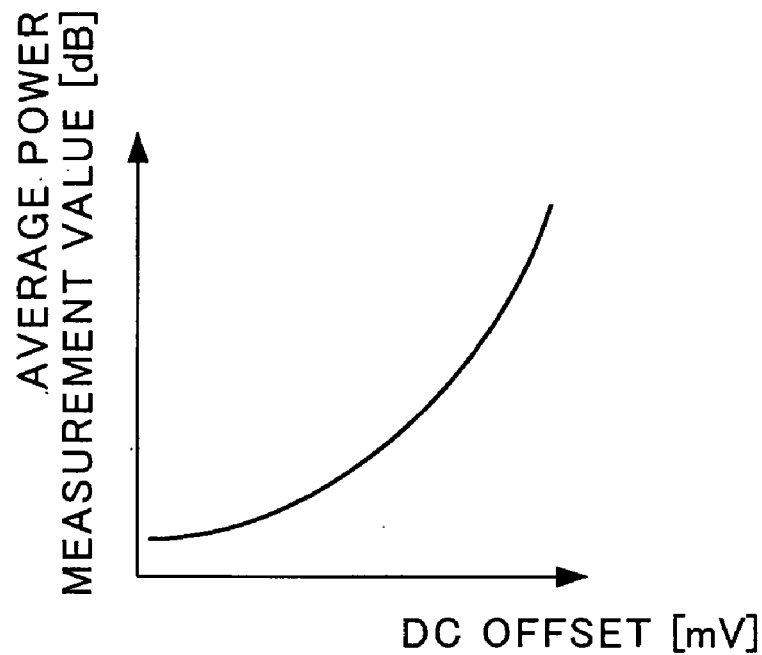
FIG. 8 is a graph showing the relationship between a DC offset amount and average power measurement value.

Meanwhile, FIG. 7 shows BER (Bit Rate Error) characteristics of a demodulated signal for DC offset value around the sensitivity level, and FIG. 8 shows variations in average power measurement value corresponding to DC offset value in a state that reception electric field is constant.

It is understood that BER characteristics of the demodulated signal deteriorate as the DC offset value increases from FIG. 7, and that the measured power level increases as the DC offset value increases from FIG. 8.

In other words, since the DC offset value has an insignificant effect in a range up to some value, it is considered as the best way determining a maximum offset value in the range of the insignificant effect as an allowable value (threshold), and increasing the cut-off frequency of the high-pass filter when the DC offset exceeds the threshold, while decreasing the cut-off frequency of the high-pass filter under other conditions.

Figure 1:
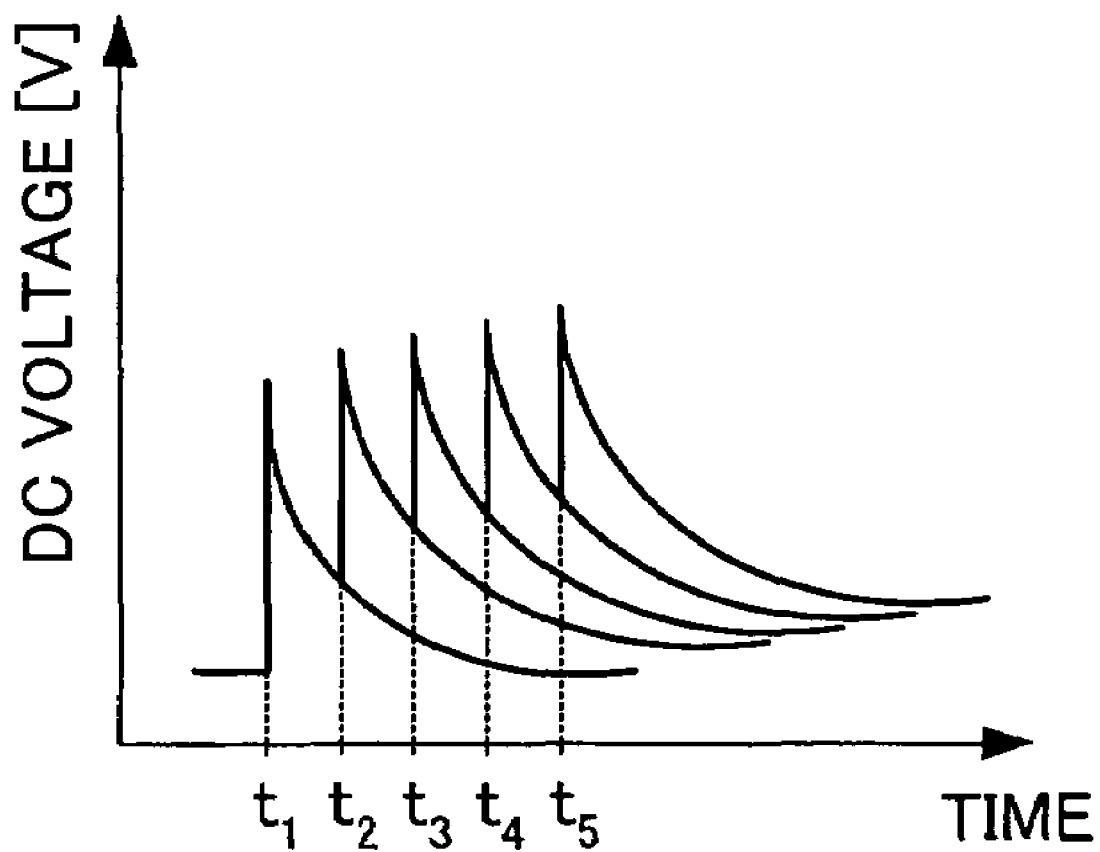
FIG. 1 is a graph showing DC offsets greatly generated by overlapping of transient response waveforms when a cut-off frequency of a high-pass filter is fixed conventionally.
Figure 9:
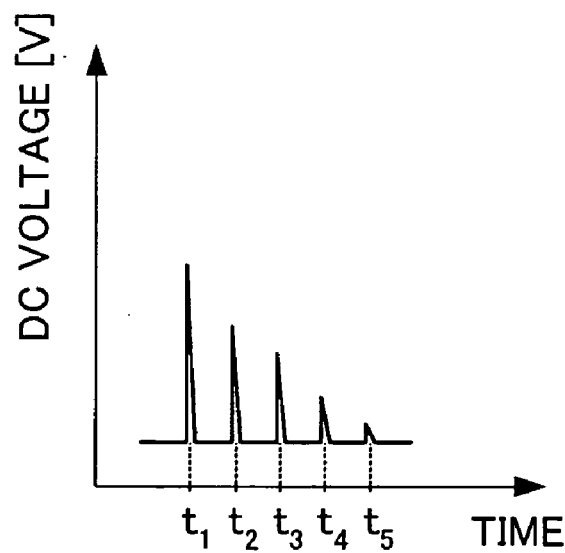
FIG. 9 is a graph showing that overlapping of transient response waveforms is not generated when the cut-off frequency is switched to a frequency higher than that in general cases.

FIG. 1 shows a state in which the DC offset is accumulating when switching of gain of the variable gain amplifier is carried out frequently at short intervals with the cut-off frequency of the high-pass filter fixed as in conventional cases, and FIG. 9 shows a variation in DC offset when the cut-off frequency of the high-pass filter is switched as appropriate using the present invention.

As can be seen from FIG. 1, when a next differential waveform is output before adequate convergence of voltage fluctuations of a differential waveform generated in response to single-switching of gain, shifts in DC component accumulate, and as a result, a remarkably large DC offset is generated.

The risk of such a large DC offset developing is high in varying the gain of the variable gain amplifier by a large amount at high speed, for example, when the power is supplied.

For example, when it is assumed that the gain of the variable gain amplifier is varied in ten levels and the current gain of level 1 is varied to level 10, since it is not possible to vary the level at a stroke, it is required to vary the level at high speed stepwise for each level.

At this point, a differential waveform is output from the high-pass filter successively whenever the gain is changed once, and as shown in FIG. 1, shifts in DC component accumulate, resulting in a large DC offset as total.

On the contrary, as shown in FIG. 9, when the time constant of the high-pass filter is decreased, the differential waveform forms a pointed shape, and the voltage level rapidly converges. In other words, overlapping of differential waveforms is eliminated, and such a condition is thereby assuredly prevented that shifts in DC component accumulate.

Accordingly, as in the present invention, by increasing the cut-off frequency of a high-pass filter instantaneously at timing of high risk of DC offset increasing to decrease the time constant, even when a variation in DC arises due to transient response, the variation converges rapidly, and it is possible to prevent variations in DC from accumulating and to always confine a DC variation amount within levels without any problems.

Based on the above-mentioned considerations, in this embodiment, the cut-off frequency of a high-pass filter is dynamically varied, while the operation timing of each section composing the AGC loop is precisely controlled with such variations in the cut-off frequency considered, and it is thereby possible to prevent the DC offset from increasing with reliability and to assure the stabilized circuit operation.

Figure 10:
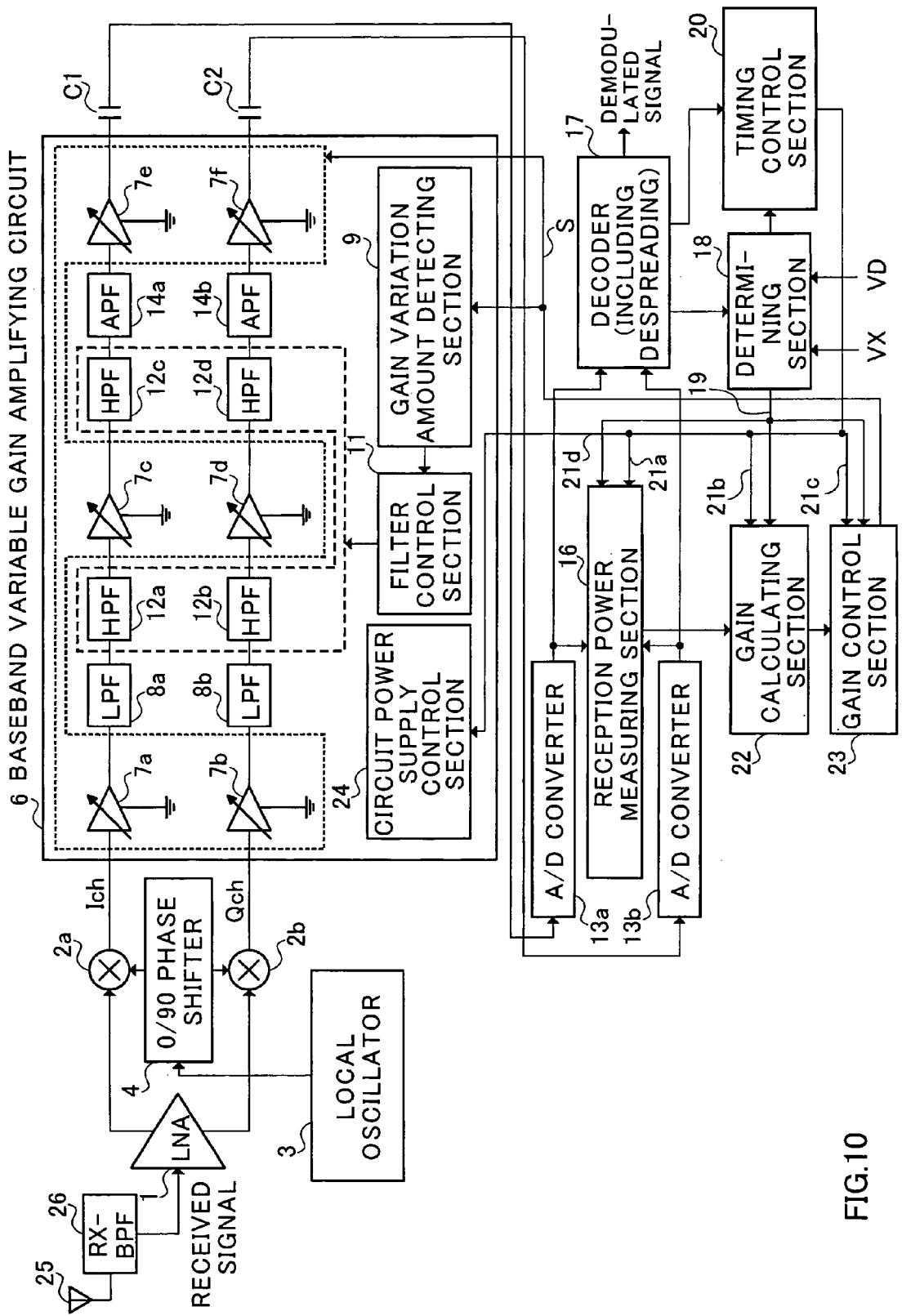
FIG. 10 is a block diagram illustrating a configuration of a direct conversion receiver (CDMA receiver provided with an internal AGC circuit) according to a first embodiment of the present invention.

As shown in FIG. 10, the direct conversion receiver of this embodiment has antenna 25, reception band-pass filter (RX-BPF) 26, low-noise amplifier (LNA) 1, quadrature mixers 2a and 2b, local oscillator 3, phase shifter 4, baseband variable gain amplifying circuit 6, DC cut capacitors C1 and C2, A/D converters 13a and 13b, decoder 17, determining section 18, reception power measuring section 16, timing control section 20, gain calculating section 22 and gain control section 23.

Baseband variable gain amplifying circuit 6 has gain variable amplifiers 7a, 7b, 7c, 7d, 7e and 7f, low-pass filters (LPF) 8a and 8b, cut-off frequency switching high-pass filters (HPF) 12a, 12b, 12c and 12d, all-pass filters (APF) 14a and 14b, gain variation amount detecting section 9 and filter control section 11.

The operation of the direct conversion receiver will be described below.

RX-BPF 26 removes unnecessary signal components (including noises due to a transmitter) of out of a reception band of a signal received in antenna 25, and the resultant is input to LNA 1. LNA 1 amplifies the modulated received signal (f0±Δf) to output to quadrature mixers 2a and 2b.

Local oscillator 3 oscillates a signal of the same frequency (f0) as the output frequency of LNA 1 to output to phase shifter 4. Phase shifter 4 outputs the signal output from local oscillator 3 to quadrature mixer 2a without shifting the phase, while advancing the phase by 90 degrees to output to quadrature mixer 2b. Each of quadrature mixers 2a and 2b multiplies the output (f0±Δf) from LNA 1 by the output (f0) from phase shifter 4, and outputs the generated baseband signal (Δf) to baseband variable gain amplifying circuit 6.

With respect to signals input to baseband variable gain amplifying circuit 6, LPFs 8a and 8b, HPFs 12a, 12b, 12c and 12d and APFs 14a and 14b remove predetermined unnecessary frequency components from the signals, and variable gain amplifiers 7a, 7b, 7c, 7d, 7e and 7f amplify the signals according to predetermined gains.

HPFs 12a, 12b, 12c and 12d remove frequency components below respective cut-off frequencies of the baseband signal, according to the cut-off frequencies set in advance by filter control section 11.

Gains of variable gain amplifiers 7a, 7b, 7c and 7d are adjusted dynamically by gain control section 23.

With respect to output signals of baseband variable gain amplifying circuit 6, I component and Q component whose phases are different from one another by 90 degrees are passed through DC cut capacitors C1 and C2, undergo A/D conversion in A/D converters 13a and 13b, and are decoded (including despreading) in decoder 17, respectively. The outputs of A/D converters 13a and 13b are also output to reception power measuring section 16.

Reception power measuring section 16 adds respective squares of amplitude of I component and Q component of the received signal to convert into a power level. In an apparatus that receives received signals with different peak factors as in the W-CDMA system, since received levels vary with reception timing (are determined according to the system), it is required to average power measurement levels for a predetermined period to convert into a power level. The measurement period is determined using a reception mode signal output from determining section 18. This respect will be described later.

Various information contained in the received signal is supplied to determining section 18, and signal VD for notifying supply of power and timing control signal VX in intermittent reception are also supplied to determining section 18.

Determining section 18 determines a current reception state from the various information contained in the received signal, or determines a current operation state of the direct conversion receiver from power supply notification signal VD and timing control signal VX in intermittent reception, notifies the determination result to timing control section 20, while providing AGC mode signal 19 to reception power measuring section 16, gain calculating section 22 and gain control section 23.

In addition, timing control section 20 provides control signals 21a to 21d respectively to reception power measuring section 16, gain calculating section 22, gain control section 23, and circuit power supply control section 24 in baseband variable gain amplifying circuit 6. Circuit power supply control section 24 turns on and off the power supply of baseband variable gain amplifying circuit 6 intermittently, and thus implements so-called intermittent reception (standby reception mode).

Herein, AGC modes in this embodiment include a high-speed mode (mode 1) and low-speed mode (mode 2). The high-speed mode (mode 1) is used in fast adapting gains of variable gain amplifiers 7a, 7b, 7c, 7d, 7e and 7f to reception environments, for example, before acquiring synchronization immediately after supplying the power, at the time of activating intermittent reception, and at the time of activating measurement of a different frequency.

Meanwhile, the low-speed mode (mode 2) is used when the gain adjustment of the variable gain amplifying circuit converges and stable data reception is carried out. In this mode, in order for the DC offset not to increase, the number of times the gain of the variable gain amplifying circuit is updated is decreased, an amount per-one update is decreased, and thus, levels of high-frequency components due to gain switching are suppressed.

Operation timings of reception power measuring section 16, gain calculating section 22 and gain control section 23 are determined based on the AGC mode signal output from determining section 18 and timing control signals 21a to 21c output from timing control section 20, respectively.

The operation timing of circuit power supply control section 24 is controlled using timing control signal 21d output from timing control section 20.

Gain control section 23 sets gains calculated in gain control section 22 for variable gain amplifiers 7a, 7b, 7d, 7d, 7e and 7f, respectively.

When a gain variation amount (a difference between a last set value and current set value) exceeds a predetermined threshold, the gain variation amount detecting section notifies the result to filter control section 11.

Upon receiving the notification from gain variation amount detecting section 9, filter control section 11 increases cut-off frequencies of high-pass filters 12a, 12b, 12c and 12d, thus decreases the time constants to converge the DC variation immediately, and after a lapse of predetermined time, decreases the cut-off frequencies. Thus switching of cut-off frequencies of high-pass filters is carried out in AGC mode 1. In other words, AGC mode 1 is a mode provided with switching of cut-off frequencies of high-pass filters.

Meanwhile, in above-mentioned AGC mode 2, filter control section 11 maintains the cut-off frequencies of high-pass filters at low values (general cut-off frequencies).

According to the operation as described above, in the direct conversion receiver equipped with the AGC circuit, it is possible to assuredly prevent occurrences of large DC offset caused by AGC.

In addition, in the AGC circuit, it is required for each section that is a structural element of the negative feedback control loop to operate in cooperation with one another in response to an AGC mode. Accordingly, in consideration of switching of time constants of high-pass filters, it is important to optimize the operation timing of each section.

In view of the foregoing, in this embodiment, reception power measuring section 16 changes the timing at which the power is measured as appropriate in response to the AGC mode.

Figure 11A:
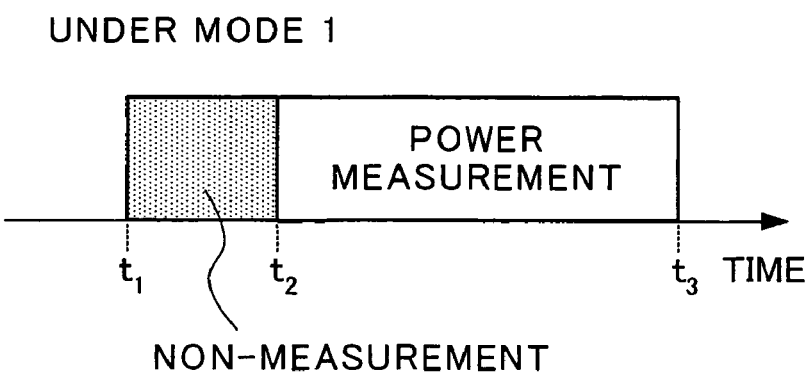
FIG. 11A is a timing diagram showing timing at which average reception power is measured when AGC mode 1 (high-speed response mode: mode with switching of cut-off frequency of a high-pass filter) is applied in the direct conversion receiver as shown in FIG. 10.

FIG. 11A is a view showing an example of timing of average power measurement in AGC mode 1 (mode provided with switching of high-pass filter), and FIG. 11 is a view showing an example of timing of average power measurement in AGC mode 2.

In FIG. 11A, assuming that an average power measurement period is from t1 to t3 (for example, which corresponds to duration of 1 slot), since the risk is high that the DC offset increases due to transient response of the high-pass filter for an initial period (t1 to t2) (therefore, time constants of the high-pass filters are switched during the period) and a possibility is high that the power measurement is not carried out accurately, the power measurement is eliminated during the period, and power is measured after the period.

Figure 11B:
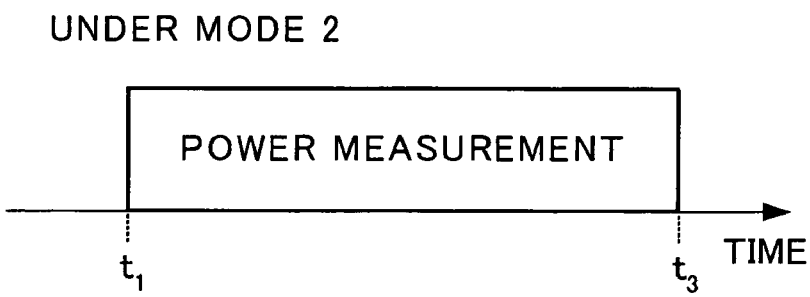
FIG. 11B is a timing diagram showing timing at which average reception power is measured when AGC mode 2 (low-speed response mode: mode without switching of cut-off frequency of the high-pass filter) is applied in the direct conversion receiver as shown in FIG. 10.

Meanwhile, in AGC mode 2 (which corresponds to a state in which AGC converges and stable reception is carried out), as shown in FIG. 11B, in order to increase the measurement accuracy, a measurement period is widened (period of t1 to t3). It is thereby possible to measure the power accurately irrespective of the operation of high-pass filters.

Further, the operation of gain calculating section 22 is controlled appropriately in response to the AGC mode. In other words, in the same way as in reception power measuring section 16, a gain calculating method and timing at which data is output to gain control section 23 are determined based on AGC mode signal 19 from determining section 18 and control signal 21b from timing control section 20.

Figure 12A:
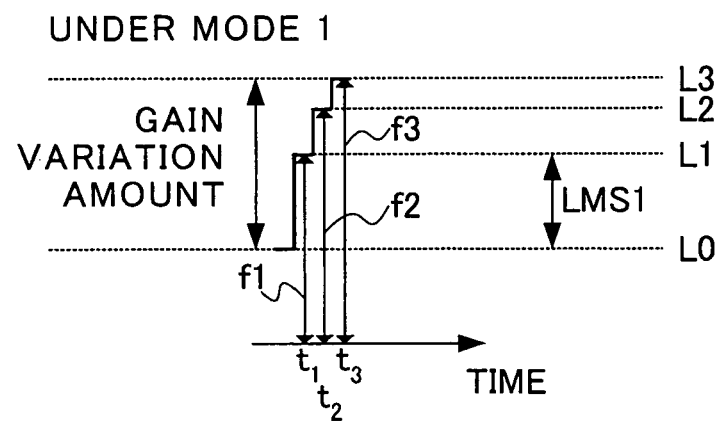
FIG. 12A is a view showing an example of a gain variation amount per-one update and a period of the update when AGC mode 1 (high-speed response mode: mode with switching of cut-off frequency of the high-pass filter) is applied in the direct conversion receiver as shown in FIG. 10.
Figure 12B:
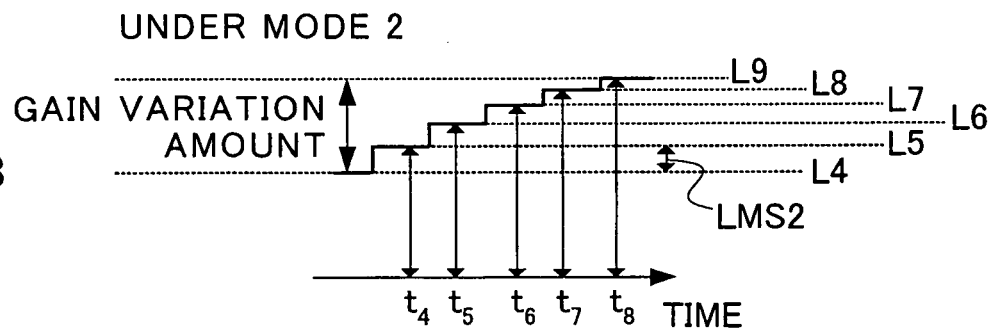
FIG. 12B is a view showing an example of a gain variation amount per-one update and a period of the update when AGC mode 2 (low-speed response mode: mode with switching of cut-off frequency of the high-pass filter) is applied in the direct conversion receiver as shown in FIG. 10.

FIG. 12A shows examples of gain variation amount per-one update and a period of the update in AGC mode 1, and FIG. 12B shows examples of gain variation amount per-one update and a period of the update in AGC mode 2.

As shown in FIG. 12A, in AGC mode 1, since it is anticipated that the gain variation amount (difference between the last gain value and current gain value for which the variable gain amplifier is set) will increase, based on the premise that the cut-off frequency of the high-pass filter is switched, the gain variation amount per-one update is made large, and gain update timing is advanced, thereby immediately converging the amplitude of a received signal to optimal amplitude.

In FIG. 12A, f1 to f3 are gain values calculated in gain calculating section 22, and the level of each gain value is varied stepwise. The maximum variation amount per-one update is of gain value of f1, where the gain value is varied from level L0 to level L1, and becomes an allowable maximum variation amount LMS 1 (maximum variation width in gain). The gain is updated periodically at short intervals (t1 to t3).

Meanwhile, as shown in FIG. 12B, in AGC mode 2, since it is anticipated that the gain variation amount will not be large, the gain variation amount per-one update is made small, and the gain update timing is delayed, thereby performing appropriate control adapted to characteristics of the high-pass filter. In particular, in AGC mode 2, since data reception is performed, the gain is varied to an extent of not generating the DC offset exceeding the allowable value, and it is thereby possible to perform stable reception.

In other words, in FIG. 12B, the allowable maximum width of the gain variation amount per-one update is limited to LMS 2. Further, the gain update interval is increased (time t4 to t8), and thus the stable operation is provided without generating a large DC offset.

In addition, it is preferable to determine the update timing of gain variation adaptably corresponding to fading frequency in practical use and envelop of modulated signal.

Gain calculating section 22 may output a gain calculation value as serial data. In the case of a variable gain amplifier in which gain control is carried out using a DC voltage, a calculation data value of gain calculating section 22 is converted into an analog voltage in a D/A converter, and is provided to a variable gain amplifier. The control using serial data will be described later specifically with reference to FIGS. 18 to 20.

The operation timing of gain control section 23 is also determined based on the AGC mode signal from determining section 18 and control signal 21c from timing control section 20.

After receiving the calculation value from gain calculating section 22, gain control section 23 promptly outputs gain control signal S to baseband variable amplifier 6, whereby it is possible to implement gain update in synchronism with a calculation period (output period) of gain value in gain calculating section 22.

Figure 13A:
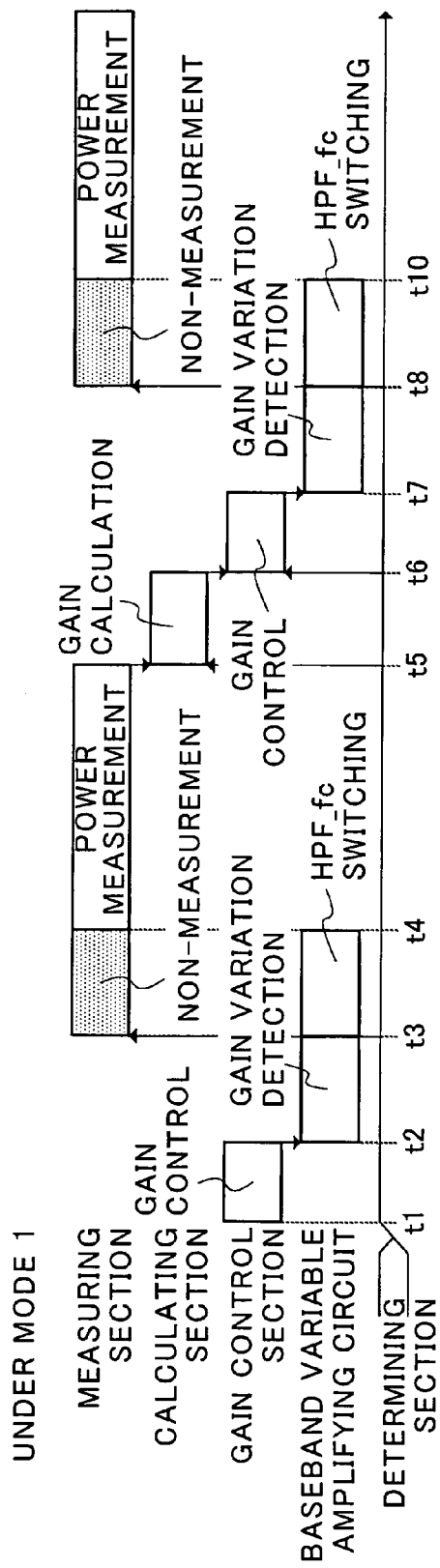
FIG. 13A is a timing diagram showing operation timing of each section composing an AGC loop when AGC mode 1 (high-speed response mode: mode with switching of cut-off frequency of the high-pass filter) is applied in the direct conversion receiver as shown in FIG. 10.
Figure 13B:
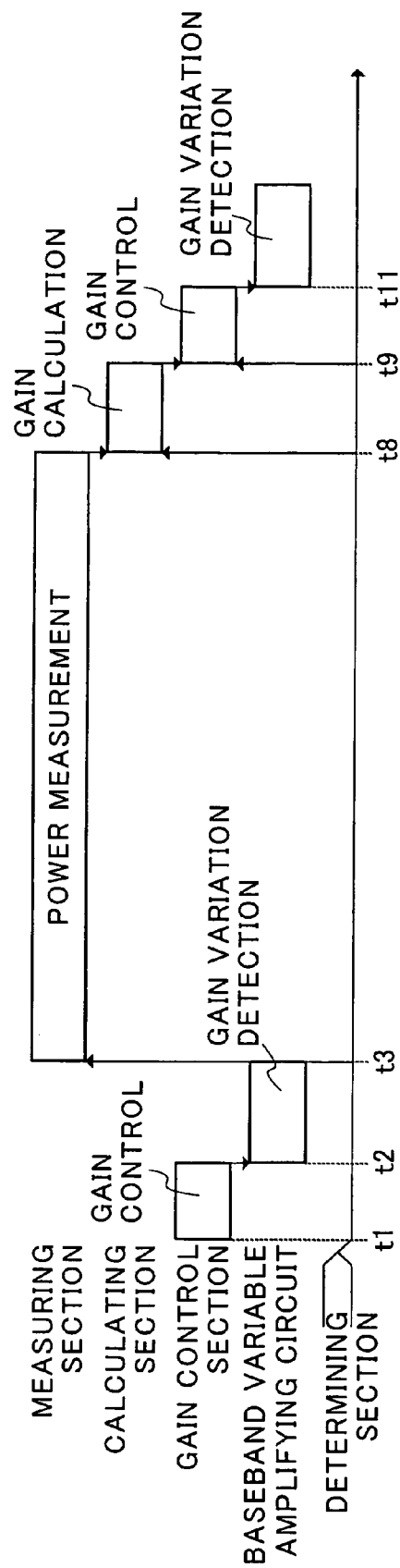
FIG. 13B is a timing diagram showing operation timing of each section composing the AGC loop when AGC mode 1 (high-speed response mode: mode without switching of cut-off frequency of the high-pass filter) is applied in the direct conversion receiver as shown in FIG. 10.

FIG. 13A is a timing diagram showing an example of operation timing of each section composing the AGC loop in AGC mode 1, and FIG. 13B is a timing diagram showing an example of operation timing of each section composing the AGC loop in AGC mode 2.

As shown in FIG. 13A, in AGC mode 1, at time t1 to t2 gain control section 23 controls gains of variable gain amplifiers 7a to 7f, and at time t2 to t3 gain variation amount detecting section 9 measures a gain variation (difference between the current value and last value).

When the detected gain variation amount exceeds a threshold, during a period of time of from t3 to t4, filter control section 11 switches cut-off frequencies (fc) of high-pass filters 12a to 12d to higher frequencies, and at time t4 the possibility is lowered that a large DC offset occurs, the cut-off frequencies of the high-pass filters are switched back to original low frequencies.

Reception power measuring section 16 halts the measurement of reception power during a period of time of from t3 to t4, and starts the measurement of average reception power from time t4. The measurement of reception power is continued until time t5, and at time t5 to t6 gain calculating section 22 calculates a gain value to set for the variable gain amplifier, based on the measured reception power. Then, the similar control is carried out after time t6.

In AGC mode 2, as shown in FIG. 13B, gain control is performed at time t1 to t2, gain variation is detected at time t2 to t3, power is measured at time t3 to t6, and the gain value is calculated at time t8 to t9. Thereafter, the similar control is carried out.

Figure 14:
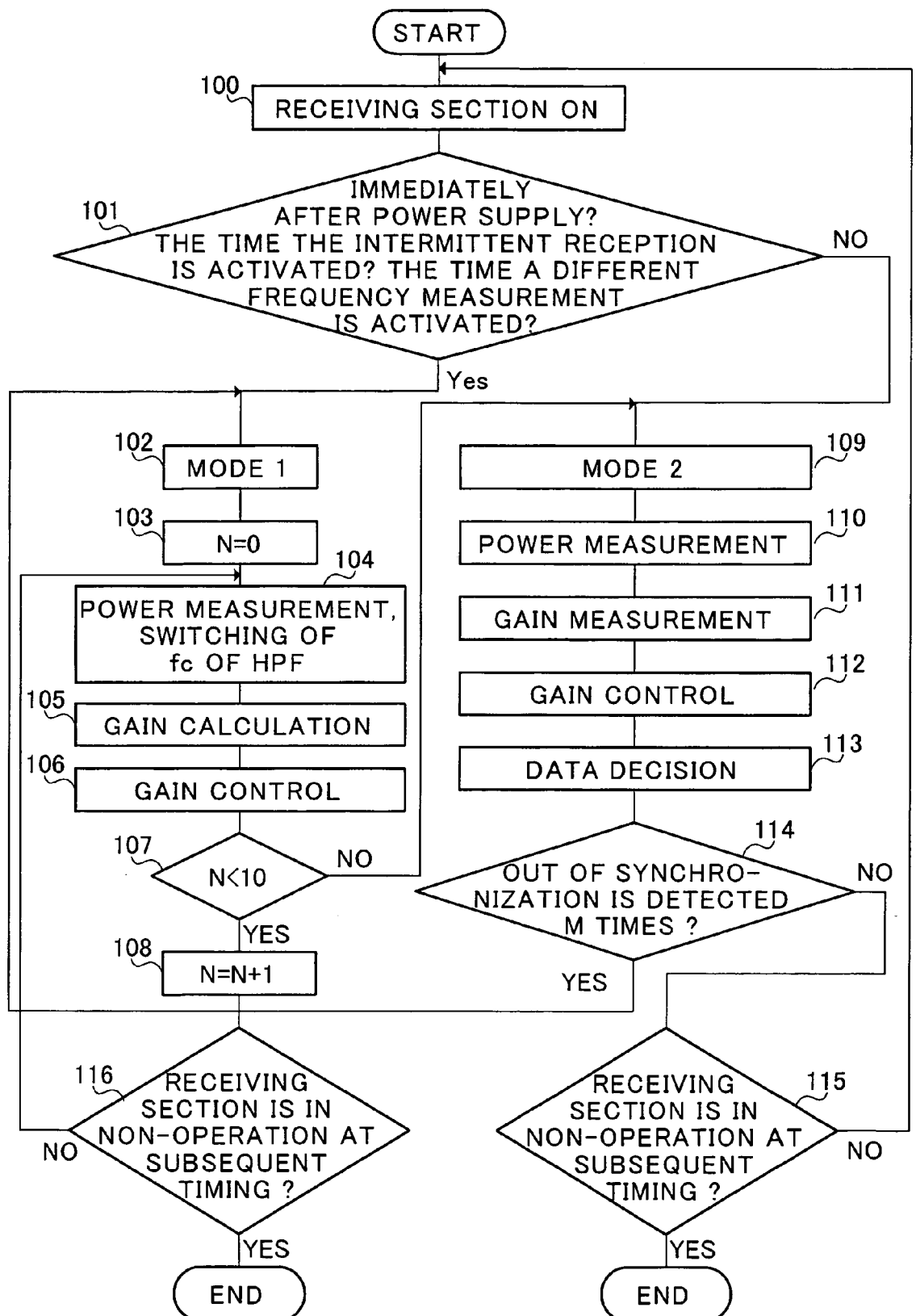
FIG. 14 is a flow diagram showing primary operation procedures in the AGC circuit (AGC circuit provided in the direct conversion receiver as shown in FIG. 10) of the present invention.

FIG. 14 shows primary operation procedures of AGC operation (including switching of AGC mode, and switching of cut-off frequency of the high-pass filter). In the flow in FIG. 14, it is a premise that the direct conversion receiver performs intermittent reception (for checking a call from a base station intermittently, and turning off the power supply of the circuitry except periods of checking) to reduce power consumption.

When a receiving section is turned on at the time the power is supplied or at timing for activating the intermittent reception (step 100), determining section 18 determines whether the power has been supplied immediately before, the intermittent reception has been activated, or measurement of different frequency has been activated due to compressed mode (step 101).

At this point, in the case where the power has been supplied immediately before, the intermittent reception has been activated, or measurement of different frequency has been activated due to compressed mode, since the gain of the variable gain amplifier does not converge and the possibility is high that the DC offset increases due to gain switching, the mode shifts to AGC mode 1 (step 102). In other cases, the mode shifts to AGC mode 2 (step 109).

In AGC mode 1, parameter N for recording the number of times that the loop is repeated is cleared to zero (step 103), and then the power is measured (when necessary, in parallel to the measurement, the cut-off frequency of the high-pass filter is switched by control of gain variation amount detecting section 9 and filter control section 11) (step 104).

Then, the gain is calculated (step 105), the gain is controlled (step 106), AGC is continued unless the loop is repeated ten times (steps 107 and 108), and the similar control is repeated immediately before the receiving section is in non-operation (step 116).

Meanwhile, in AGC mode 2, the power is measured (step 110), the gain is calculated (step 111), the gain is controlled (step 112), and data decision is made (step 113).

Then, when out of synchronization is detected M times in step 114, since it is required to set the gain of the variable gain amplifier again starting with the first setting, the mode is back to AGC mode 2. Meanwhile, when out of synchronization is not detected, the similar control is repeated immediately before the receiving section is in non-operation (step 115).

In this way, in the direct conversion receiver (a W-CDMA receiver provided with an internal AGC circuit) of this embodiment, against the problem that the DC offset increases due to switching of gain of a variable gain amplifier in AGC, the measure is automatically taken that the time constant of the high-pass filter is shorten to absorb the transient response rapidly, while modes are divided into a mode (AGC mode 1) provided with thus switching of the cut-off frequency of the high-pass filter, and another mode (AGC mode 2) for stable operation, and the operation of each section composing the AGC loop is controlled optimally, thereby implementing extremely excellent negative feedback control while eliminating the fear that AGC becomes unstable.

Figure 15:
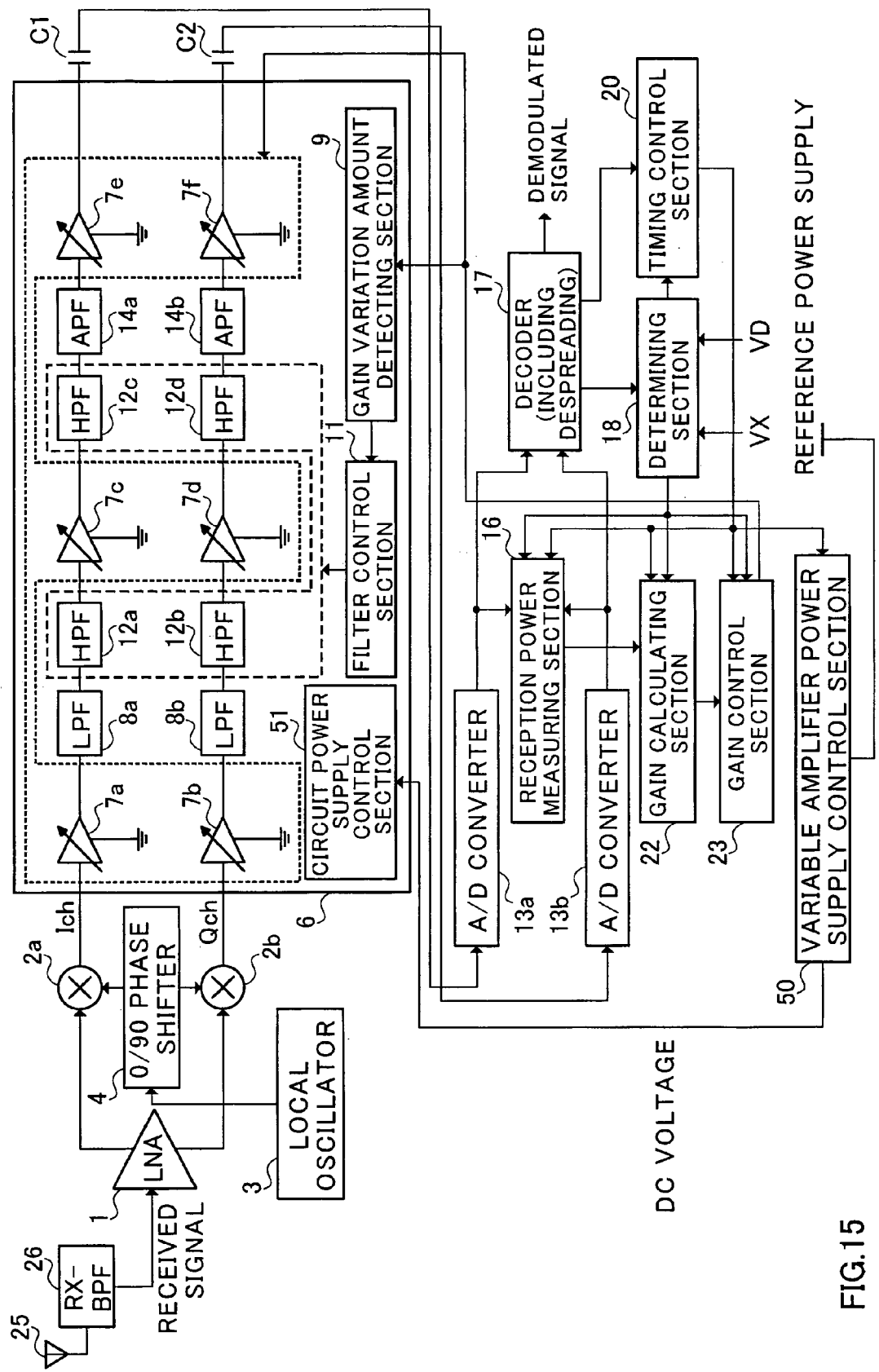
FIG. 15 is a block diagram illustrating a configuration of a modification example where a power supply control scheme is only changed in the baseband variable gain amplifying circuit without changing the primary configuration of the direct conversion receiver as shown in FIG. 10.

FIG. 15 shows a configuration of a modification example. The configuration of the direct conversion receiver in FIG. 15 is the same as the configuration in FIG. 10 except a configuration for turning on/off the power supply of baseband variable gain amplifying circuit 6.

In the case of FIG. 10, circuit power supply control section 24 internally provided in baseband variable gain amplifying circuit 6 turns on/off the circuit power supply based on timing control signal 21d from timing control section 20.

On the contrary, in FIG. 15, variable amplifier power supply control section 50 is externally provided, and controls the supply of power supply voltage. Baseband variable gain amplifying circuit 6 in FIG. 15 is provided with circuit (power input section) 51 through which input is the power supply voltage provided from outside.

(Second Embodiment)

Figure 16:
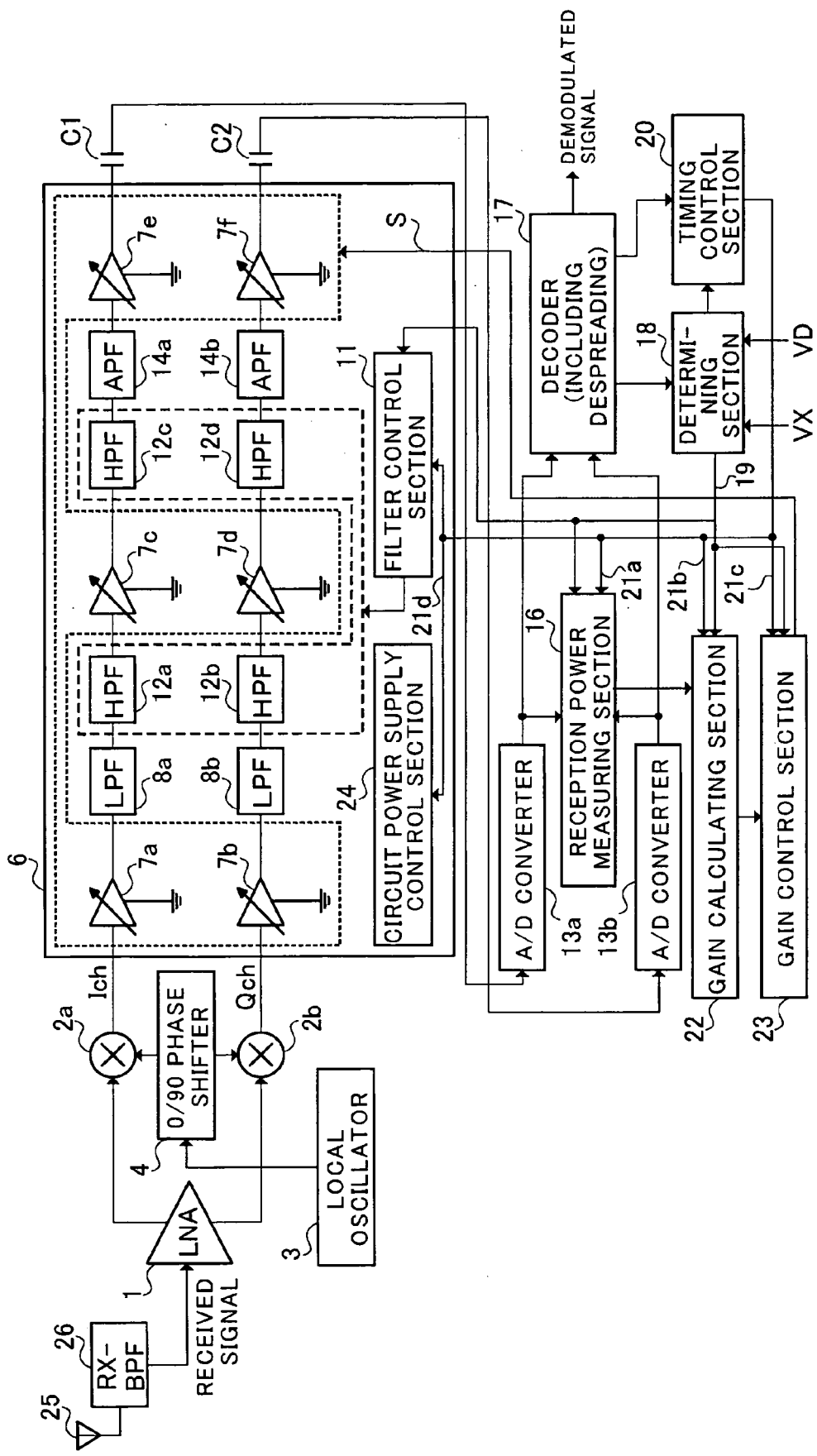
FIG. 16 is a block diagram illustrating a configuration of a direct conversion receiver (CDMA receiver provided with an internal AGC circuit) according to a second embodiment of the present invention.

FIG. 16 is a block diagram illustrating a configuration of a direct conversion receiver (W-CDMA receiver provided with an internal AGC circuit) according to the second embodiment of the present invention.

The primary configuration of the receiver according to this embodiment is almost the same as in the first embodiment (FIG. 10). In this embodiment, features are that switching of time constant of the high-pass filter is controlled based on AGC mode signal 19 output from determining section 18 and timing control signal 21e from timing control section 20, and that gain variation amount detecting 9 in FIG. 10 is eliminated.

As described above, the switching of cut-off frequency of the high-pass filter is required when AGC does not converge at all, for example, immediately after the power is supplied, and the loop needs to be repeated at high speed to adapt the gain of the variable gain amplifier to propagation environments at high speed.

The operation in each section of the AGC loop in such a case is subject to centralized control by determining section 18 and timing control section 20. Accordingly, it is possible to control the timing for switching the high-pass filter using AGC mode signal 19 output from determining section 18 and control signal 21e output from timing control section 20.

In view of the forgoing, in FIG. 16, filter control section 11 is given AGC mode signal 19 output from determining section 18 and control signal 21e output from timing control section 20.

In this way, the need of gain variation amount detecting section 9 as shown in FIG. 10 is eliminated, enabling simplified circuitry.

In addition, when applying the configuration as shown in FIG. 16, it is required to match a delay in a signal line through which AGC mode signal 19 output from determining section 18 is conveyed to filter control section 11 with a delay in a signal line through which control signal 21e output from timing control section 20 is conveyed to filter control section 11 with accuracy.

Figure 17:
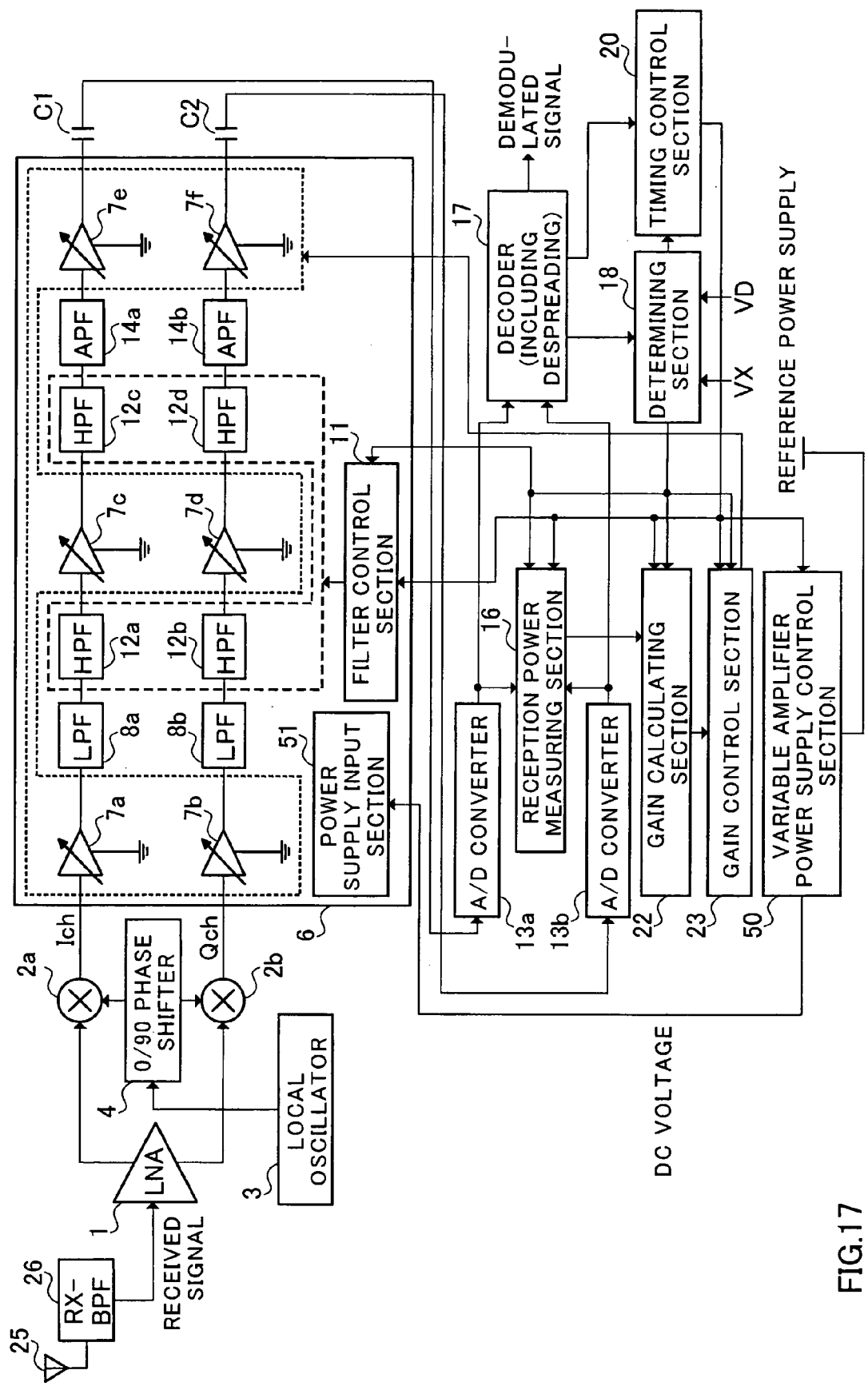
FIG. 17 is a block diagram illustrating a configuration of a modification example where a power supply control scheme is only changed in the baseband variable gain amplifying circuit without changing the primary configuration of the direct conversion receiver as shown in FIG. 16.

FIG. 17 is a block diagram illustrating a configuration of a modification example.

A configuration of a direct conversion receiver as shown in FIG. 17 is the same as the configuration as shown in FIG. 16 except a configuration for turning on/off the power supply of baseband variable gain amplifying circuit 6.

In the case of FIG. 16, circuit power supply control section 24 internally provided in baseband variable gain amplifying circuit 6 turns on/off the circuit power supply based on timing control signal 21d from timing control section 20.

On the contrary, in FIG. 17, variable amplifier power supply control section 50 is externally provided, and controls the supply of power supply voltage. Baseband variable gain amplifying circuit 6 in FIG. 17 is provided with circuit (power input section) 51 through which input is the power supply voltage provided from outside.

(Third Embodiment)

Various methods are considered as methods for implementing in actual circuitry the switching of cut-off frequency of the high-pass filter that is the feature of the present invention. This embodiment describes various modifications of the configuration for switching the cut-off frequency that are not disclosed in the above-mentioned embodiments.

Figure 18:
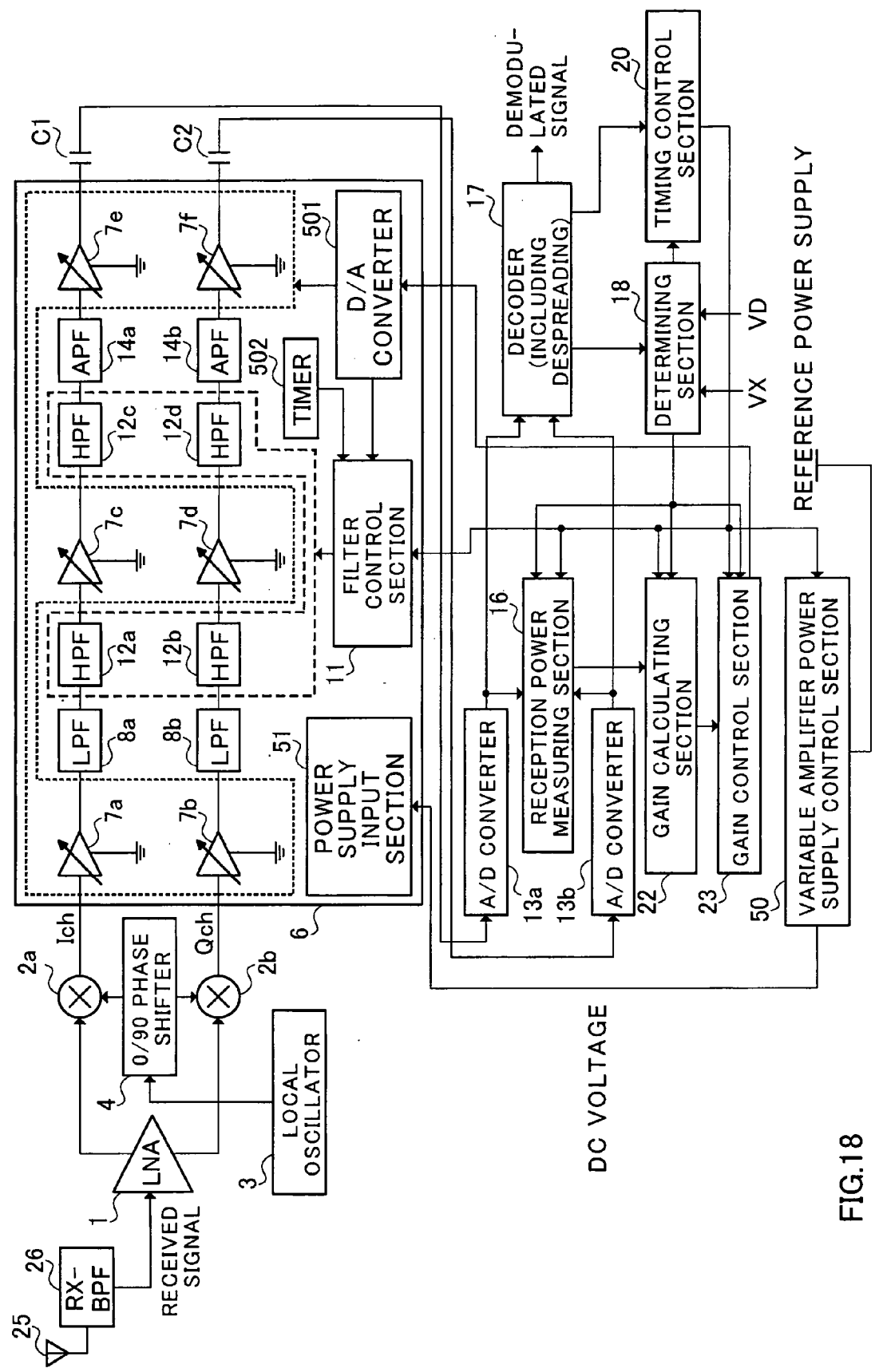
FIG. 18 is a block diagram illustrating an example of a configuration of a circuit (where gain control of a variable gain amplifier is carried out using serial data) in a direct conversion receiver according to a third embodiment of the present invention.

FIG. 18 illustrates an example where a direct conversion receiver controls the gain of the variable gain amplifier using digital data (serial data) instead of using an analog control signal.

Gain control section 23 outputs a gain control signal (serial data). For example, the serial data has a width of 16 bits, and among the bits, 10 bits are of gain data, while remaining 6 bits are available for use in various control.

Then, the control data is "1" when switching the cut-off frequency of the high-pass filter. On the contrary, when the control data is "0", the switching of cut-off frequency is not carried out.

In this way, when the gain is adjusted using digital data, it is easy to transmit data indicative of whether or not to switch the cut-off frequency of the high-pass filter.

In addition, it is required to provide baseband variable gain amplifying circuit 6 with a D/A converter as an interface. When the gain is adjusted using an analog control signal, the operation can be carried out automatically that the cut-off frequency of the high-pass filter is increased by switching of from AGC mode 2 to AGC mode 1, while the cut-off frequency is decreased to the original one by switching of from AGC mode 1 to AGC mode 2. When the gain is adjusted using the serial data, in order to once increase the cut-off frequency of the high-pass filter and then decrease the frequency to the original one, it is required to input digital data again to instruct or to perform time control using a timer.

In FIG. 18, inside baseband variable gain amplifying circuit 6 are provided D/A converter 501 and timer 502, thereby enabling detection of a lapse of predetermined time after switching the cut-off frequency of the high-pass filter, and at timing at which the predetermined time has elapsed, filter control section 11 switches the cut-off frequency to the original one.

Figure 19:
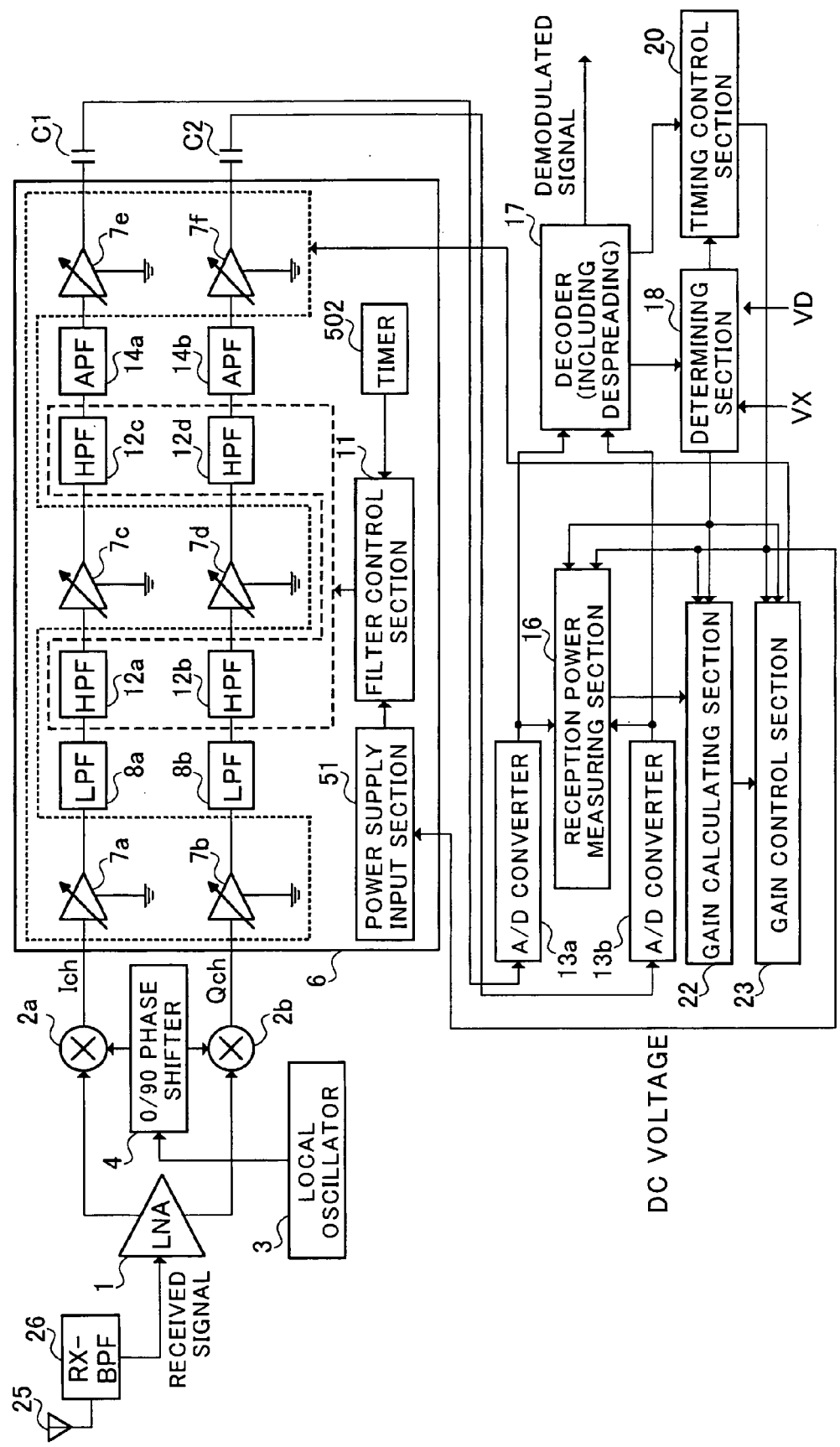
FIG. 19 is a block diagram illustrating an example of a configuration of a circuit (where a time constant of a high-pass filter is switched using ON of power supply as a trigger) in the direct conversion receiver according to the third embodiment of the present invention.

In FIG. 19, in the case of adjusting the gain using an analog control signal, filter control section 11 switches the cut-off frequency of the high-pass filter to the higher one, using ON of the power supply of baseband variable gain amplifying circuit 6 as a trigger.

In other words, as described above, among states having problems with increases in DC offset are a state immediately after the power is supplied and a state immediately after the circuit power supply is turned on in the intermittent reception. It is possible to detect such a state by watching the operation of the section for controlling the circuit power supply.

Therefore, in FIG. 19, at timing at which the power supply voltage is supplied from power supply input section 51, filter control section 11 switches the cut-off frequency of the high-pass filter to the higher one. Then, timer 502 checks a lapse of predetermined time, and at which the predetermined time has elapsed, the cut-off frequency is switched to the original one.

In the case of the configuration in FIG. 19, it is not required to watch the gain variation amount as in FIG. 10, and it is possible to switch the time constant of the high-pass filter with attention only drawn to ON of the power supply, whereby it is possible to simplify the circuit configuration.

Figure 20:
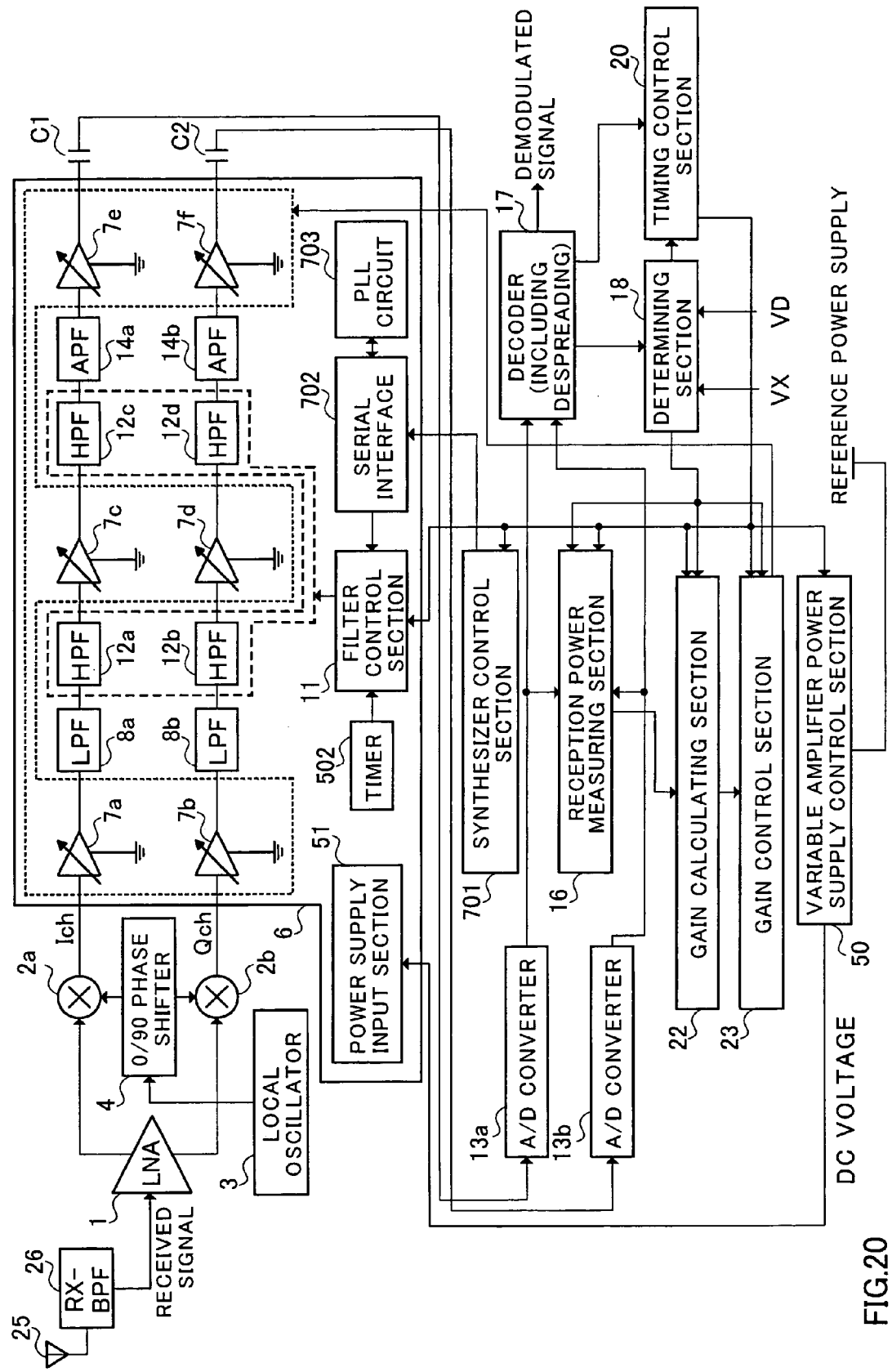
FIG. 20 is a block diagram illustrating an example of a configuration of a circuit (where switching of time constant of a high-pass filter is instructed using a PLL synthesizer) in the direct conversion receiver according to the third embodiment of the present invention.

Further, in FIG. 20, based on the premise that baseband variable gain amplifying circuit 6 has an internal PLL circuit (a frequency synthesizer using PLL), by controlling the frequency of an output signal of the PLL circuit from outside, switching of cut-off frequency of the high-pass filter is instructed.

The PLL frequency synthesizer (PLL circuit) is a circuit where a variable frequency-divider is inserted into a PLL loop, the dividing ratio for which the divider is set is varied, and an oscillation output of a desired frequency is thereby extracted.

In FIG. 20, such PLL circuit 703 is provided in baseband variable gain amplifying circuit 6. Synthesizer control section 701 outputs serial control data, and serial interface 702 interprets the serial control data to provide to filter control section 11 as a control signal for switching the oscillation frequency of PLL circuit 703 and for switching the cut-off frequency (since a large variation in electric field level is expected due to switching of oscillation frequency, i.e., identification of different frequency, the cut-off frequency is switched concurrently).

Thus, by using the existing circuit provided in baseband variable gain amplifying circuit 6, it is possible to switch the cut-off frequency of the high-pass filter effectively. In addition, the control for switching back the cut-off frequency is carried out using timer 502 as in cases of FIGS. 18 and 19.

As described above, in the AGC circuit in the direct conversion receiver and the CDMA receiver equipped with the AGC circuit of the present invention, it is possible to assuredly prevent occurrences of a problem of DC offset caused by AGC operation (increases in DC shift due to accumulation of transient response waveform of the high-pass filter), while assuring that the AGC operation necessary for stabilizing the amplitude of received signals is carried out at high speed with stability adapting to environments, using the new method of decreasing the time constant of the high-pass filter only for an extremely short time and thereby converging the transient oscillating waveform rapidly.

In other words, by switching the cut-off frequency (fc) of the high-pass filter, the optimal reception condition is always implemented.

That is, as in conventional cases, in the case where characteristics of the high-pass filter are fixed (the cut-off frequency of the high-pass filter is low), when the gain of the variable gain amplifier is varied largely, demodulation timing differs from ideal timing (sampling point) greatly due to an occurrence of DC offset, demodulation accuracy (bit error) deteriorates, and a large power measurement error occurs, thereby substantially disabling the reception.

Meanwhile, when increasing the cut-off frequency of the high-pass filter, i.e., bringing the cut-off frequency close to the frequency of a modulated signal (received signal) component, the amplitude and phase of the modulated signal (received signal) vary greatly, and the demodulation accuracy degrades. To avoid such problems, it is preferable to set the cut-off frequency of the high-pass filter at a low frequency. In such setting, under conditions that the variation in DC offset does not occur, it is possible to achieve excellent reception conditions.

Accordingly, in order to take advantages of both cases, in the present invention, the cut-off frequency of the high-pass filter is switched dynamically at optimal timing.

In this way, it is possible to take advantages of high-pass filter excellent in transient characteristics (where the cut-off frequency is high) and a high-pass filter excellent in static characteristics (where the cut-off frequency is low), and thus, excellent reception conditions are always achieved.

Further, with respect to AGC indispensable to CDMA receivers, it is possible to perform optimal control (switching between high-speed mode and low-speed mode, etc.) without concerning decreases in reception accuracy.

It is thus possible to practically install the direct conversion receiver having characteristics such that the receiver is compact and excellent in reduction in power consumption in a CDMA (including a W-CDMA system and systems confirming to IS95) receiver, thereby implementing miniaturization and low power consumption in the receiver.

As described above, in the present invention, during a period of time having a possibility that a DC offset in the internal circuit of the direct conversion receiver increases beyond the allowable value due to AGC operation, the cut-off frequency (time constant) of the high-pass filter is switched and controlled dynamically, and shifts in DC component are prevented from accumulating (being added). In this way, it is possible to install the direct conversion receiver in a communication apparatus (such as a W-CDMA receiver) provided with an internal AGC circuit with reliability.

Further, since the AGC circuit in the direct conversion receiver of the present invention has a circuit (i.e., a circuit for detecting a risky period and switching the time constant of the high-pass filter) to solve the problem that the DC offset increases due to the AGC operation, such a self-contradiction does not arise that increasing the gain of the AGC loop to fast adapt to reception states generates a situation where the convergence of AGC is rather delayed. Accordingly, it is possible to perform AGC freely in response to environments.

Furthermore, in the AGC circuit, it is required for sections composing the negative feedback control loop to cooperate with stability in synchronism with one another. In the AGC circuit of the present invention, a plurality of AGC modes are provided in consideration of the presence or absence of switching of cut-off frequency of the high-pass filter, and the sections perform respective optimal operations for each mode. In other words, each of all the sections such as the measuring section, calculating section, gain control section and power supply control section in the variable amplifier is controlled appropriately, instead of controlling only the high-pass filter in the variable gain amplifier, and therefore, it is assured that the AGC circuit always operates with stability in any situations.

By applying the present invention, it is possible to practically use, as a CDMA receiver, a direct conversion receiver which has excellent characteristics but is difficult to put into practical use because of the problem of the DC offset. It is thereby possible to achieve further reduction in size and power consumption (long-life of battery) in a CDMA receiver.

According to an aspect of the present invention, during a period of time having a high possibility of increasing a DC offset, a time constant of a high-pass filter for cutting off a DC component existing on a signal path is made smaller than that in general operation. In this way, the transient response of a signal passed through the high-pass filter is converged rapidly, the overlapping of differential waveforms is eliminated, and it is thereby possible to prevent shifts in DC component from accumulating.

According to another aspect of the present invention, in the above-mentioned configuration, the period of time having a high possibility of increasing a DC offset is determined, by detecting that a variation amount in gain exceeds a predetermined amount where the variable gain amplifier that is a structural element of the AGC loop is set for the gain, or by detecting that a direct conversion receiver is currently in either of a period immediately after the power is supplied, a period immediately after the receiver is activated in the intermittent reception, and a period immediately after activating measurement of a different frequency in a W-CDMA system.

An AGC circuit according to another aspect of the present invention has a filter control section which switches the cut-off frequency of the high-pas filter to a frequency higher than that in general operation, and thereby decreases the time constant of the high-pass filter to converge the DC variation at high speed when a variation amount in gain exceeds a predetermined amount where the variable gain amplifier that is a structural element of the AGC loop is set for the gain, or the direct conversion receiver is currently in either of a period immediately after the power is supplied, a period immediately after the receiver is activated in the intermittent reception, and a period immediately after activating measurement of a different frequency in the W-CDMA system.

In an AGC circuit according to another aspect, a gain variation amount detecting section detects that a variation amount in gain of the variable gain amplifier is more than or equal to a predetermined amount, and upon receiving a notification of the detection result, the filter control section switches the cut-off frequency of the high-pass filter to a high frequency.

In an AGC circuit according to another aspect, in the above-mentioned configuration, during a period of time the cut-off frequency of the high-pass filter is switched to the high frequency, a gain calculating section and gain control section perform at least one of processing for increasing a variation width in gain per-one update and for decreasing a period of the update, and implement AGC faster than that in general operation. Since the risk of DC offset is reduced, the gain in negative feedback loop is increased to respond to reception environments faster.

In an AGC circuit according to another aspect, in the above-mentioned configuration, the filter control section switches the cut-off frequency of the high-pass filter to the high frequency and then switches the cut-off frequency to the low frequency gain. The power measuring section does not measure reception power during a period of time the cut-off frequency of the high-pass filter is switched to the high frequency in a predetermined period in measuring the average reception power for the predetermined period. Since the reliability of actual power measurement value is low during a period of time the DC offset increases, no use of the value as a basis for AGC prevents the reliability of the control from deteriorating.

An AGC circuit according to another aspect of the present invention has a determining section which determines whether or not a state has a high possibility of increasing a DC offset of a signal passed through the high-pass filter, based on information contained in a demodulated signal, or based on an operation state of the direct conversion receiver, and which notifies the determination result to the filter control section. Upon receiving the notification from the determining section, the filter control section switches the cut-off frequency of the high-pass filter to the high frequency. According to this configuration, the need of the above-mentioned gain variation amount detecting section is eliminated.

A CDMA receiver according to another aspect of the present invention is a CDMA receiver equipped with either AGC circuit as described above. The CDMA receiver has excellent advantages such as a small size, light weight, and low power consumption that the direct conversion receiver has, and assures its stable operation without deterioration of demodulation accuracy caused by the DC offset and instability of AGC.

A baseband variable gain amplifying circuit according to another aspect of the present invention switches the cut-off frequency of a high-pass filter by detecting a gain variation amount.

A baseband variable gain amplifying circuit according to another aspect of the present invention switches the cut-off frequency of a high-pass filter based on an AGC mode signal and timing control signal.

A baseband variable gain amplifying circuit according to another aspect of the present invention receives digital control data and switches the cut-off frequency of a high-pass filter.

A baseband variable gain amplifying circuit according to another aspect of the present invention switches the cut-off frequency of a high-pass filter, using a PLL synthesizer.

A baseband variable gain amplifying circuit according to another aspect of the present invention switches the cut-off frequency of a high-pass filter, using timing at which the power supply is turned on as a reference.

This application is based on the Japanese Patent Application No.2002-020251 filed on Jan. 29, 2002, entire content of which is expressly incorporated by reference herein.

INDUSTRIAL APPLICABILITY

The present invention is applied to an AGC (Automatic Gain Control) circuit in a direction conversion receiver, a CDMA (Code Division Multiple Access) receiver and baseband variable gain amplifying circuit.

The invention claimed is:

1. An AGC circuit in a direct conversion receiver for multiplying a received high-frequency signal by a local signal with a frequency substantially the same as that of the high-frequency signal to directly convert into a baseband signal, amplifying the baseband signal using a baseband variable gain amplifying circuit having a variable gain amplifier, low-pass filter and a high-pass filter for cutting off a DC component as structural elements, and performing A/D conversion and demodulation on the resultant, the AGC circuit comprising:

a power measuring section that measures reception power based on a signal subjected to A/D conversion;

a gain calculating section that calculates a gain of the variable gain amplifier using information of a difference between measured reception power and a target convergence value;

a gain control section that controls the gain of the variable gain amplifier based on the calculated gain;

a filter control section that has a function of switching a cut-off frequency of the high-pass filter between at least high-and-low two frequencies; and a gain variation amount detecting section that reports to the filter control section upon detecting that the gain of the variable gain amplifier varies by an amount equal to or greater than a predetermined amount as a result of control by the gain control section, wherein:

the filter control section switches the cut-off frequency of the high-pass filter to a high frequency upon receiving the report from the gain variation amount detecting section; and the gain calculating section and the gain control section perform at least one of processing for increasing a range of gain variation per update and processing for shortening a period of the update during a period of time the cut-off frequency of the high-pass filter is switched to the high frequency.

2. The AGC circuit in the direct conversion receiver according to claim 1, wherein:

the filter control section switches the cut-off frequency of the high-pass filter to the high frequency and then switches the cut-off frequency to a low frequency again; and the power measuring section does not measure reception power during a period of time the cut-off frequency of the high-pass filter is switched to the high frequency in a predetermined period in measuring average reception power for the predetermined period.

3. A CDMA receiver provided with the AGC circuit in the direct conversion receiver according to claim 1.

4. An AGC circuit in a direct conversion receiver for multiplying a received high-frequency signal by a local signal with a frequency substantially the same as that of the high-frequency signal to directly convert into a baseband signal, amplifying the baseband signal using a baseband variable gain amplifying circuit having a variable gain amplifier, low-pass filter and a high-pass filter for cutting off a DC component as structural elements, and performing A/D conversion and demodulation on the resultant, the AGC circuit comprising:

a power measuring section that measures reception power based on a signal subjected to A/D conversion;

a gain calculating section that calculates a gain of the variable gain amplifier using information of a difference between measured reception power and a target convergence value;

a gain control section that controls the gain of the variable gain amplifier based on the calculated gain;

a filter control section that has a function of switching a cut-off frequency of the high-pass filter between at least high-and-low two frequencies; and a determining section that determines whether or not there is a high possibility of increasing a DC offset of a signal passed through the high-pass filter, based on information contained in a demodulated signal, or based on an operation state of the direct conversion receiver, and reports the determination result to the filter control section, wherein:

the filter control section switches the cut-off frequency of the high-pass filter to the high frequency upon receiving the report from the determining section; and the gain calculating section and the gain control section perform at least one of processing for increasing a range of gain variation per update and processing for shortening a period of the update during a period of time the cut-off frequency of the high-pass filter is switched to the high frequency.

5. The AGC circuit in the direct conversion receiver according to claim 4, wherein:

the filter control section switches the cut-off frequency of the high-pass filter to the high frequency and then switches the cut-off frequency to a low frequency again; and the power measuring section does not measure reception power during a period of time the cut-off frequency of the high-pass filter is switched to the high frequency in a predetermined period in measuring average reception power for the predetermined period.

6. A CDMA receiver provided with the AGC circuit in the direct conversion receiver according to claim 4.

7. A baseband variable gain amplifying circuit that is provided in a direct conversion receiver and that amplifies a baseband signal, comprising:
- a variable gain amplifier that amplifies the baseband signal;
- a high-pass filter that cuts off a DC component existing on a signal path of the baseband signal and that enables a cut-off frequency to be varied between at least low- and-high two frequencies;
- a gain variation amount detecting section that detects an amount of gain variation at which the variable gain amplifier is set equal to or greater than a predetermined amount;
- a filter control section that switches the cut-off frequency of the high-pass filter to a high frequency when the gain variation amount detecting section detects that the amount of gain variation is equal to or greater than the predetermined amount; and
- a gain control section that performs at least one of processing for increasing a range of gain variation per update and processing for shortening a period of the update during a period of time the cut-off frequency of the high-pass filter is switched to the high frequency.

8. A baseband variable gain amplifying circuit that is provided in a direct conversion receiver and that amplifies a baseband signal, comprising:
- a variable gain amplifier that amplifies the baseband signal;
- a high-pass filter that cuts off a DC component existing on a signal path of the baseband signal and that enables a cut-off frequency to be varied between at least low- and-high two frequencies;
- a D/A converter that converts data of a gain at which the variable gain amplifier is set and digital data including data for instructing switching of the cut-off frequency of the high-pass filter into an analog signal;
- a filter control section that switches the cut-off frequency of the high-pass filter based on a signal corresponding to the data for instructing switching of the cut-off frequency; and
- a gain control section that performs at least one of processing for increasing a range of gain variation per update and processing for shortening a period of the update during a period of time the cut-off frequency of the high-pass filter is switched to the high frequency.

* * * * *